US005592010A

United States Patent [19]

Kakumu et al.

[11] Patent Number: 5,592,010

[45] Date of Patent: Jan. 7, 1997

[54] SEMICONDUCTOR DEVICE

[75] Inventors: Masakazu Kakumu, Kawasaki, Japan; Kazutaka Nogami, Palo Alto, Calif.; Yuki Satoh, Tokyo, Japan

[73] Assignee: Kabushiki Kaisha Toshiba, Tokyo, Japan

[21] Appl. No.: 343,359

[22] Filed: Nov. 22, 1994

Related U.S. Application Data

[63] Continuation of Ser. No. 71,305, Jun. 2, 1993, abandoned.

[30] Foreign Application Priority Data

Jun. 2, 1992 [JP] Japan .................................... 4-141505

[51] Int. Cl.$^6$ .................................................... H01L 29/76

[52] U.S. Cl. .......................... 257/368; 257/369; 257/299

[58] Field of Search .................................... 257/368, 369, 257/299; 307/304, 475

[56] References Cited

U.S. PATENT DOCUMENTS

| | | | |
|---|---|---|---|
| T954,006 | 1/1977 | Lee et al. | 257/368 |
| 4,937,700 | 6/1990 | Iwahashi | 257/368 |
| 4,961,007 | 10/1990 | Kumanoya et al. | 307/296.2 |
| 5,286,985 | 2/1994 | Taddiken | 257/368 |

FOREIGN PATENT DOCUMENTS

| | | |
|---|---|---|
| 0222472 | 5/1987 | European Pat. Off. . |
| 0469587 | 2/1992 | European Pat. Off. . |
| 3009447 | 9/1980 | Germany . |
| 8905545 | 6/1989 | WIPO . |

*Primary Examiner*—Mark V. Prenty
*Attorney, Agent, or Firm*—Loeb & Loeb LLP

[57] ABSTRACT

A semiconductor device comprising a main circuit having a p-channel MOSFET formed on the surface off the substrate and an n-channel MOSFET formed on the p-type well region which is formed on the n-type Si substrate chip), an input/ output (I/O) circuit formed on the substrate, and a substrate bias generating circuit formed on the substrate, characterized by controlling the substrate bias generating circuit via the I/O circuit, and varying a bias supplied to the substrate and the p-type well region, in accordance with the operation mode of the main circuit.

17 Claims, 3 Drawing Sheets

SEMICONDUCTOR DEVICE

This is a continuation of application Ser. No. 08/071,305, filed Jun. 2, 1993, now abandoned.

BACKGROUND OF THE INVENTION

1. Field of the Invention

This invention relates to a semiconductor device, and more particularly to a semiconductor device wherein an integrated circuit including MOSFETs allows a potential of its substrate having the device to be varied.

2. Description of the Related Art

An integrated circuit includes many MOSFETs. ON-OFF switching characteristics of a transistor depend on a threshold voltage of each MOSFET. The threshold voltage depends on limitations of the integrated circuit such as the speed, the standby current, etc. i.e. the current drivability of the MOSFET or the leakage current of the MOSFET when the gate voltage is 0 V.

The threshold voltage of the MOSFET is generally determined by the thickness of a gate oxide film or the impurity concentration in the Si substrate under the gate oxide film. In general, in order to increase the threshold voltage, it is merely necessary to increase the thickness of the gate oxide film or the impurity concentration in the Si substrate under the gate oxide film. On the other hand, in order to lower the threshold voltage, it is necessary to reduce the thickness of the gate oxide film and the impurity concentration in the Si substrate under the gate oxide film. However, if the threshold voltage is increased, the current drivability of the MOSFET fails while the leakage current is restricted. On the other hand, if the threshold voltage is decreased, the current drivability of the MOSFET increases and at the same time the leakage current increases.

As explained above, when the threshold voltage of the MOSFET is set, the leakage current and the current drivability are set by themselves. If the MOSFET is scaled down, the thickness of the gate oxide thickness must be reduced small to prevent the punch-through and the short channel effect. In this case, a preferable threshold voltage may not be obtained unless the impurity concentration is excessively increased.

There is a manner proposed to solve this problem, such as supplying a substrate bias to a portion of the integrated circuit or all the portions thereof, and this is accomplished mainly in a DRAM. Since the substrate bias causes the threshold voltage of the MOSFET to be increased, the leakage current can be lowered even at the time when the impurity concentration is slightly low. Then, it has been proposed and accomplished to vary the impurity concentration in the Si substrate under the gate oxide film of the MOSFET in the integrated circuit in accordance with an area of the substrate, to set the threshold voltage of the MOSFET to be small for the purpose of increasing the current drivability, or to set the threshold voltage of the MOSFET to be great for the purpose of increasing the leakage current.

This improvement manner is effective when the concentration is low or when the operating voltage is under 5V. However, if the degree of the integration of MOSFET is increased, difficulty in the processes is also increased, since preparation manners for the high-speed operation is not consistent with that for the low standby. If the operating voltage is lowered, a rate of the threshold voltage to the operating voltage is increased to keep off-leakage current, and thus the difficulty is further increased.

It is analytically known that the threshold voltage should be under 0.3 V to maintain the high-speed operation, i.e. the threshold voltage should be approximately under 20% of the operating voltage, for example when the operating voltage is 1.5 V. On the other hand, in order to make the standby current of an integrated circuit having more than 300,000 logic gates approximately under 10 μA, the threshold voltage .should be higher than 0.6 V. If operating voltage is different, since the threshold voltage for keeping high-speed operation is different, for example, the threshold voltage of 0.6 V is enough for high-speed operation when an operating voltage is 3 V, however the threshold voltage than 0.3 V is required when an operating voltage is 1.5 V. Therefore it is very difficult to set both a proper threshold voltage and a low standby current in the conventional manner.

As described above, in the semiconductor device having the MOSFETs, only one threshold voltage value can be set by one MOSFET in the integrated circuit. Setting both the high-speed operation of the integrated circuit and the low standby current or determining the optimum threshold voltage at which the operating voltages are different is difficult in prior art.

SUMMARY OF THE INVENTION

The object of this invention is to provide a semiconductor device wherein optimum threshold voltages of MOSFET can be set by an operating mode or an operating voltage such as the high-speed performance of MOSFET is considered or when a low power dissipation is considered.

In the first semiconductor device of the present invention, a substrate bias of MOSFET is varied according to the operating mode or voltage of the main circuit. The semiconductor device of this invention is characterized in that the threshold voltage of MOSFET is initially set small, for example, the circuit is kept operated during the time when the circuit performance is considered; and at the time of the standby, the threshold voltage of MOSFET is varied to be great by supplying the substrate bias, the leakage current of MOSFET is restricted, and the standby current is lowered.

In the second semiconductor device of the present invention, the substrate bias formed the MOSFET is varied in accordance with the value of the operating voltage of the main circuit.

The first semiconductor device is characterized by comprising a first conductive semiconductor substrate having at least one main circuit which includes at least one of at least one p-channel MOSFET and at least one n-channel MOSFET, and bias generating means for varying a bias voltage supplied to the substrate in accordance with the operation mode of said main circuit.

The second semiconductor device is characterized by comprising a first conductive semiconductor substrate having at least one main circuit which includes at least one of at least one p-channel MOSFET and at Least one n-channel MOSFET, and bias generating means for varying a bias voltage supplied to the substrate in accordance with the operation voltage of said main circuit.

According to the invention, the substrate bias in the main circuit is varied in accordance with the operation mode or the operating voltage of the main circuit. Therefore, both the high-speed performance and type low power dissipation or the determination of the optimum threshold voltage at different operating voltage can be achieved.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

Figure 1:
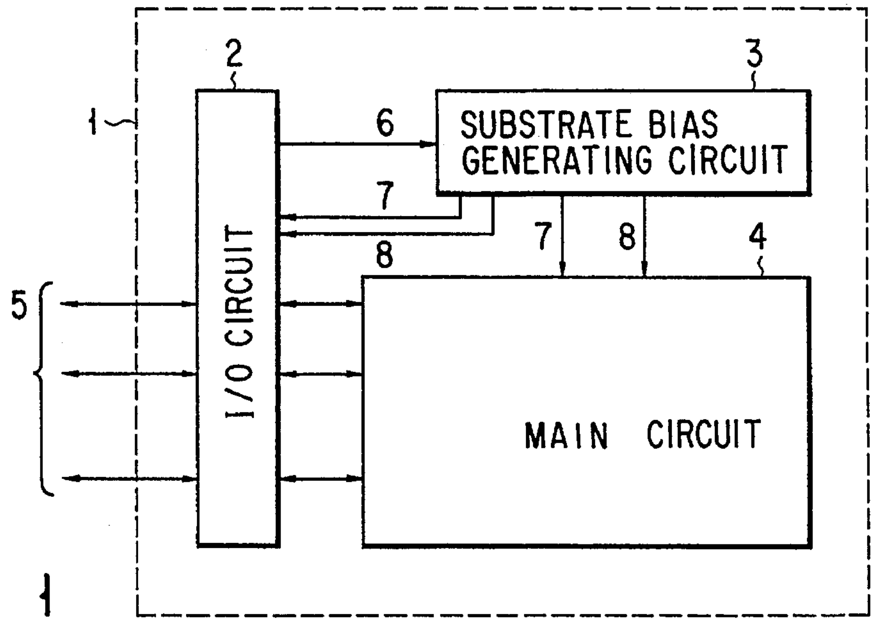
FIG. 1 is a schematic block diagram showing a circuit configuration of a semiconductor device according to the first embodiment.

This invention will be explained below in detail with reference to embodiments shown in the drawings.

FIG. 1 is a schematic block diagram showing a circuit of a semiconductor device according to the first embodiment of this invention.

An LSI chip 1 has an input/output (I/O) circuit 2, a substrate bias generating circuit 3, and a main circuit 4. The LSI chip 1 is in the CMOS structure in which an n-type substrate has a p-type well. The I/O circuit 2 performs the input/output of the data in/from the outside. The substrate bias generating circuit 3 generates potentials of, for example, both –0.5 V and 0.5 V, on the basis of a signal 6 supplied through the I/O circuit 2. The main circuit 4 comprises p-channel and n-channel MOSFETs.

Figure 2:
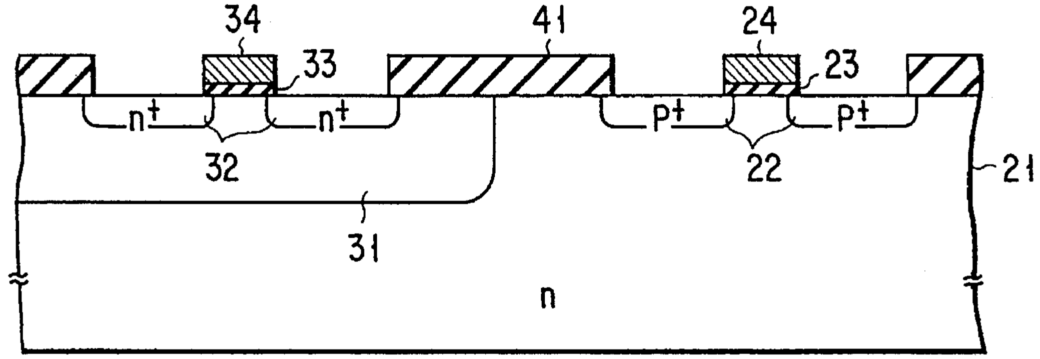
FIG. 2 is a sectional view showing an element structure according to the first embodiment.

FIG. 2 is a cross-sectional view showing an element structure of the LSI chip 1, and particularly a fundamental structure of the main circuit 4.

A p-type well (second conductive well) 31 is formed on a portion of a surface layer of an n-type Si substrate (first conductive semiconductor substrate) 21. Formed on the surface of the substrate 21 is a $p^+$-type source-drain region 22 and a p-channel MOSFET (first MOSFET) consisting of a gate oxide film 23 and a gate electrode 24, and formed on the surface of a p-type well 31 is an $n^+$-type source-drain region 32 and an n-channel MOSFET (second MOSFET) consisting of a gate oxide film 33 and a gate electrode 34. An element separating insulator 41 is formed between the p-channel MOSFET and the n-channel MOSFET.

Circuit operations of a semiconductor device according to this invention having the above structure will be explained.

The LSI chip 1 includes the n-channel MOSFET (hereinafter called "nMOS") and the p-channel MOSFET (hereinafter called "pMOS") which have a dimension of 0.5 μm at minimum. The thickness of the gate oxide film is 11 nm, and the peak value of impurity concentration is approximately $1.5\times10^{17}$ $cm^{-3}$. When the substrate bias is 0 V, the threshold voltage of the nMOS is 0.3 V and the threshold voltage of the pMOS is –0.3 V.

When the LSI chip 1 is in the standby mode, a potential of –0.5 V is generated at the p-type well 31 having the nMOS and a potential of 0.5 V is generated at the n-type substrate 21 having the pMOS, through the paths of a signal 7 and a signal 8. Then, the threshold voltage of the nMOS is varied to approximately 0.6 V, and the threshold voltage of the pMOS is varied to approximately –0.6 V. Therefore, the subthreshold leakage current of the MOSFET is approximately 1 pA/μm, and if the total length of width of transistors included in the LSI chip 1 is approximately 10 m, a very small standby current of 10 μA can be realized at an entire LSI. On the other hand, since no substrate bias is generated during the operation of the MOSFET, the substrate bias is 0 V, and since the threshold voltage of the nMOS is 0.3 V and the threshold voltage of the pMOS is –0.3 V, no performance of the LSI chip is degraded at all.

Another circuit operation of the semiconductor device according to this invention will be explained below. In an integrated circuit similar to the above circuit, when the substrate bias is 0 V, the threshold voltage of the nMOS is 0.6 V and the threshold voltage of the pMOS is –0.6 V. At this time, the subthreshold leakage current of the MOSFET is approximately 1 pA/μm. If the total length of the width of transistors included in the LSI chip 1 is approximately 10 m, a very small standby current of 10 μA can be realized at the entire LSI chip.

During the operations, a potential of 0.3 V is generated at the p-type well 31 having the nMOS and a potential of –0.3 V is generated at the n-type substrate 21 having the pMOS, through the paths of the signals 7 and 8. Then, the threshold voltage of the nMOS is varied to approximately 0.3 V and the threshold voltage of the pMOS is varied to approximately –0.3 V, and consequently no performance of the LSI chip is degraded at all.

As described above, according to the semiconductor device of this invention, the substrate bias generating circuit 3 is formed together with the main circuit 4 in the LSI chip 1, and the substrate bias is variably set in accordance with the operation mode of the MOSFET. Therefore, the threshold voltage can be set low when a high-speed performance is considered important, and it can be set high when low power dissipation at the standby is considered important. Accordingly, the current drivability during the operations can be developed and at the same time the leakage current at the standby can be reduced, i.e. both the high-speed performance and the low power dissipation can be achieved without complicated processes. This advantage is effective particularly when the operating voltage is lowered and the integration degree is increased.

In the first embodiment, the substrate bias is varied at operation and standby as an operating mode. The present invention is not limited to this embodiment, the substrate bias may be varied by a high-speed mode and a low-speed mode at operation.

The other embodiments of the semiconductor device of this invention will be explained with reference to FIGS. 3 to 5. In the figures, the portions as shown in FIG. 1 have the same reference numerals, and their detailed explanations are omitted.

Figure 3:
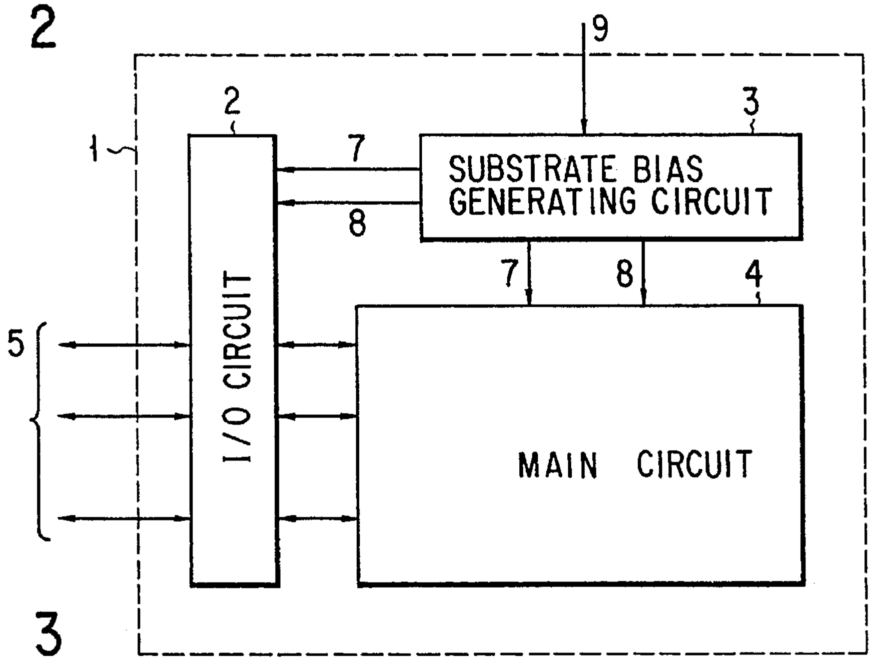
FIG. 3 is a schematic block diagram showing a circuit configuration of a semiconductor device according to the second embodiment.

FIG. 3 is a schematic block diagram showing the circuit configuration of the semiconductor device according to the second embodiment. In the semiconductor device of the third embodiment, an ON-OFF operation of the substrate bias generating circuit 3 is not performed by the I/O signal, but by a control signal 9 from the outside.

Figure 4:
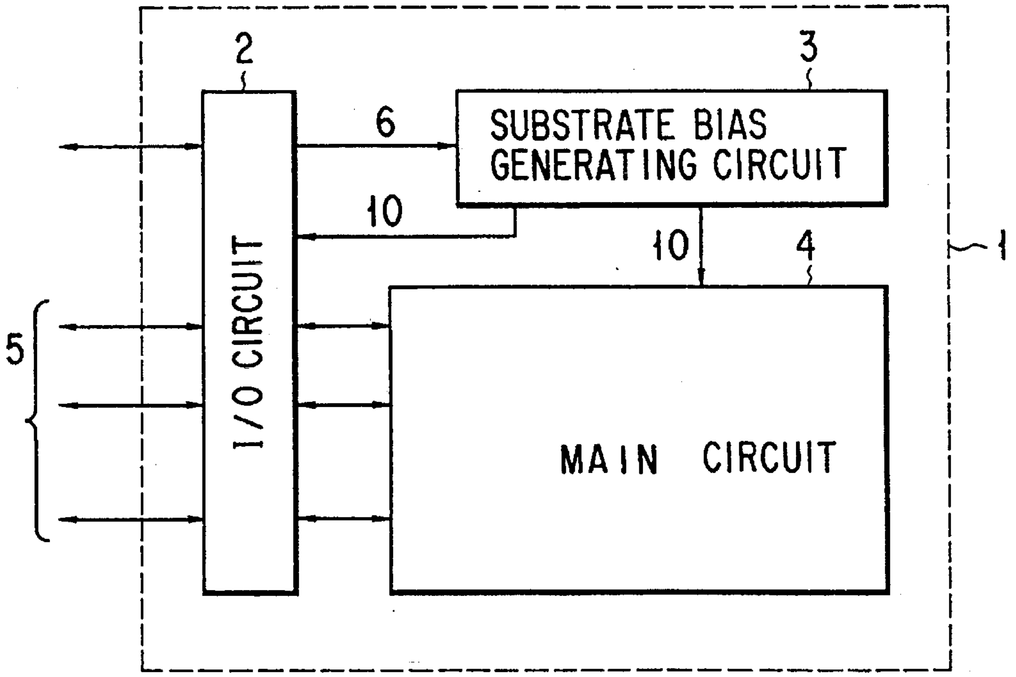
FIG. 4 is a schematic block diagram showing a circuit configuration of a semiconductor device according to the third embodiment.

FIG. 4 is a schematic block diagram showing the circuit configuration of the semiconductor device according to the third embodiment. In the semiconductor device of the fourth embodiment, the substrate bias is not simultaneously supplied to the p-type well having the nMOS and the n-type substrate having the pMOS, but the bias voltage is supplied to either the p-type well or the substrate through the path of a signal 10. In the fourth embodiment, for example, a potential of –0.5 V may be supplied to only the p-type well and conversely a potential of 0.5 V may be supplied to only the n-type substrate.

Figure 5:
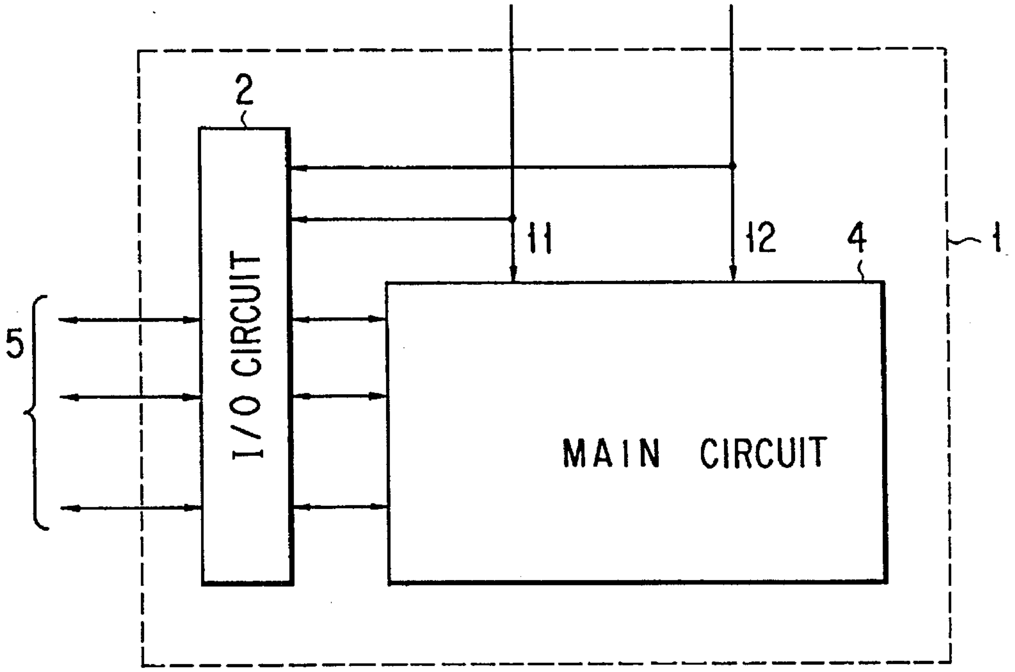
FIG. 5 is a schematic block diagram showing a circuit configuration of a semiconductor device according to the fourth embodiment.

FIG. 5 is a schematic block diagram showing the circuit configuration of the semiconductor device according to the fourth embodiment. In the semiconductor device of the fourth embodiment, a bias voltage is supplied directly from the outside to both the n-type substrate and the p-type well, or either the n-type substrate or the p-type well, to control the bias in the system.

Figure 6:
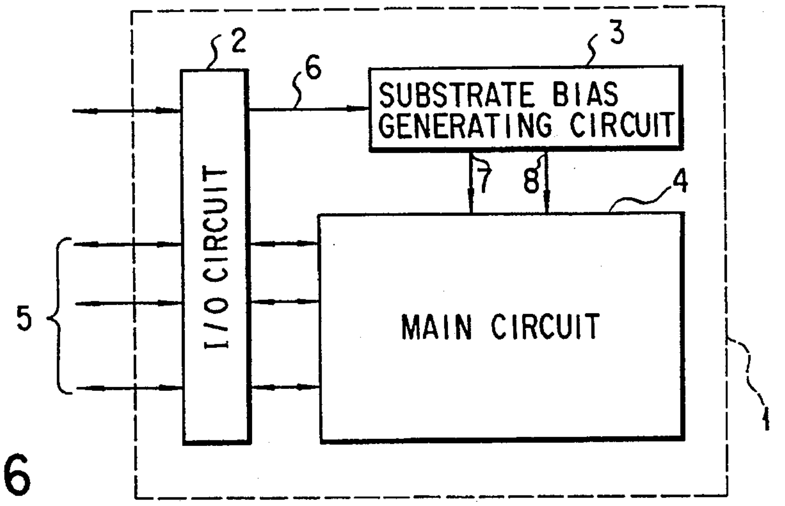
FIG. 6 is a schematic block diagram showing a circuit configuration of a semiconductor device according to the fifth embodiment.

FIG. 6 is a schematic block diagram showing a circuit configuration of a semiconductor device according to the fifth embodiment. In the semiconductor device of the fifth embodiment, the I/O circuit 2 does not receive the outputs 7 and 8 from the substrate bias generating circuit 3, thus the I/O circuit 2 controls only the main circuit 4 not to control the substrate bias.

The same advantage as obtained in the semiconductor device of the first embodiment can be obtained in the semiconductor devices of the second, third and fifth embodiments.

Figure 7:
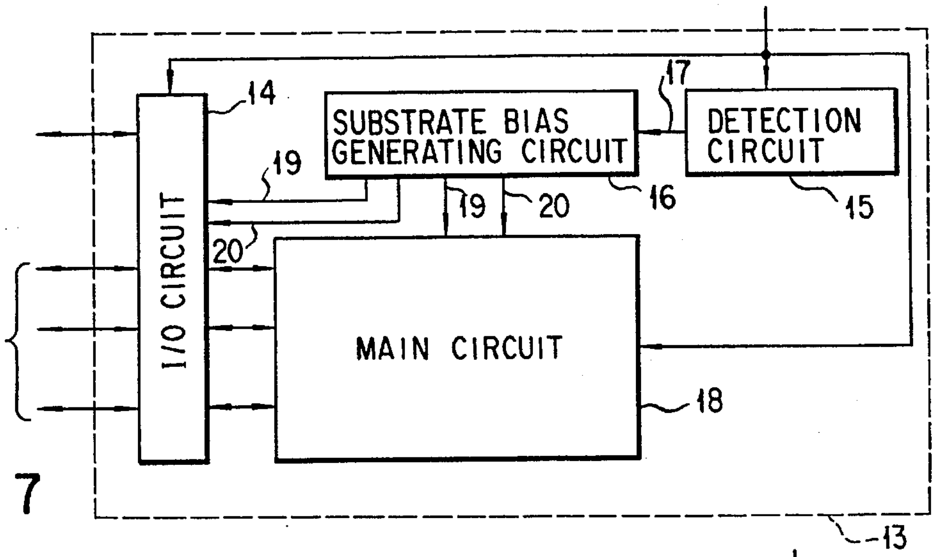
FIG. 7 is a schematic block diagram showing a circuit configuration of a semiconductor device according to the sixth embodiment.

The sixth embodiment of the present invention will be explained with reference to FIG. 7. FIG. 7 is a schematic block diagram showing a circuit configuration of a semiconductor device according to the sixth embodiment.

In FIG. 7, the semiconductor device comprises an LSI chip 13, an input/output (I/O) circuit 14, a detection circuit 15, a substrate bias generating circuit 16, and a main circuit 18. The LSI chip 13 is in the CMOS structure in which an n-type substrate has a p-type well. The I/O circuit 14 performs the input/output of the data in/from the outside. The detection circuit 15 detects the input voltage to the LSI chip 13. The substrate bias generating circuit 3 generates potentials of, for example, –1.5 V and 1.5 V, on the basis of a signal 17 supplied through the detection circuit 15. The main circuit 18 comprises p-channel and n-channel MOSFETs. The LSI chip 13 has the I/O circuit 14, the detection circuit 15, the substrate bias circuit 16 and the main circuit.

The cross-sectional view showing fundamental structure of the LSI chip 13 is about the same as the first embodiment and the detail explanation will be omitted.

The operation of the circuit will be explained. The threshold voltage of the nMOS is set to 0.1 V and that of pMOS to –0.1 V when the substrate bias is 0 V.

The detection circuit 15 outputs the H-level voltage when for example the 3 V is inputted to the LSI chip 13. This H-level voltage is inputted to the substrate bias generating circuit 16 through the pass of the signal 17. The substrate bias generating circuit 16 generates the potential of –1.5 V to the p-type well 31 on which the nMOS is formed and the potential of 1.5 V to the n-type substrate 21 on which the pMOS is formed through the pass of the signal 19 and 20 on the basis of the signal 17. The threshold voltage of the nMOS is set to approximately 0.6 V and the threshold voltage of the pMOS is set to approximately –0.6 V. Therefore, the high-speed performance and the low power dissipation can be achieved at 3 V operation.

The detection circuit 15 outputs the L-level voltage when for example the 1.5 V is inputted to the LSI chip 13. This L-level voltage is inputted to the substrate bias generating circuit 16 through the pass of the signal 17. The substrate bias generating circuit 16 generates the potential of –0.7 V to the p-type well 31 on which the nMOS is formed and the potential of 0.7 V to the n-type substrate 21 on which the pMOS is formed through the pass of the signal 19 and 20 on the basis of the signal 17. The threshold voltage of the nMOS is set to approximately 0.3 V and the threshold voltage of the pMOS is set to approximately –0.3 V. Therefore, the high-speed performance and the low power dissipation can be achieved at 1.5 V operation.

As described above, since the appropriate threshold voltage being equal to or lower than 15 to 20% of the operating voltage can be achieved by comprising the detection circuit, high-speed operation can be assured in wide range of the voltage.

Another embodiment of the circuit operation of the sixth embodiment will be explained. The threshold voltage of the nMOS is set to 0.5 V and that of pMOS to –0.5 V when the substrate bias is 0 V.

The detection circuit 15 outputs the H-level voltage when for example the 5 V is inputted to the LSI chip 13. This H-level voltage is inputted to the substrate bias generating circuit 16 through the pass of the signal 17. The substrate bias generating circuit 16 generates the potential of –0.8 V to the p-type well 31 on which the nMOS is formed and the potential of 0.8 V to the n-type substrate 21 on which the pMOS is formed through the pass of the signal 19 and 20 on the basis of the signal 17. The threshold voltage of the nMOS is set to approximately 1 V and the threshold voltage of the pMOS is set to approximately –1 V. Therefore, the high-speed performance and the low power dissipation can be achieved at 5 V operation.

The detection circuit 15 outputs the L-level voltage when for example the 3 V is inputted to the LSI chip 13. This L-level voltage is inputted to the substrate bias generating circuit 16 through the pass of the signal 17. The substrate bias generating circuit 16 does not generate the substrate bias to be set to 0 V, the threshold voltage of the nMOS is 0.5 V and the threshold voltage of the pMOS is –0.5 V. Therefore, the high-speed performance and the low power dissipation can be achieved at 3 V operation.

As described above, an inhibition of leakage current due to the punch through caused by increasing the voltage and low power dissipation can be achieved by generating the substrate bias to raise the threshold voltage.

In the present invention, LSI chip 13 comprises the main circuit 18, the substrate bias generating circuit 16 and the detection circuit 15, and the substrate bias is set according to the operating voltage of the main circuit 18. Therefore, the determination of the threshold voltage when high-speed performance at the different operating voltage or low power dissipation is considered, can be automatically achieved by the chips which are made in the same process condition.

Figure 8:
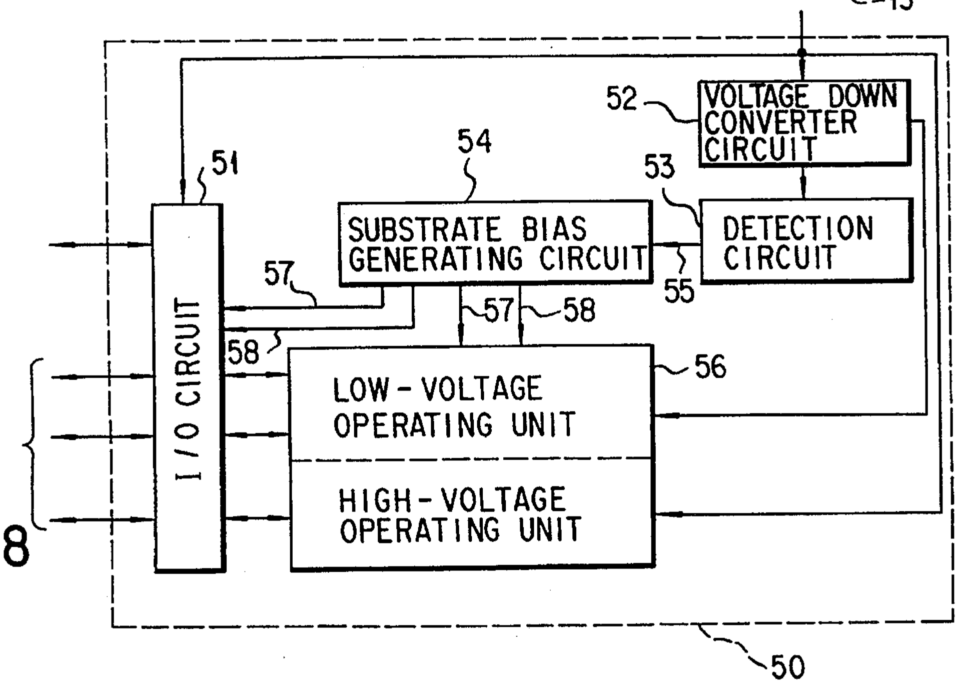
FIG. 8 is a schematic block diagram showing a circuit configuration of a semiconductor device according to the seventh embodiment.

The seventh embodiment of the present invention will be explained with reference to FIG. 8. FIG. 8 is a schematic block diagram showing a circuit configuration of a semiconductor device according to the seventh embodiment.

In FIG. 8, the semiconductor device comprises an LSI chip 50, an input/output (I/O) circuit 51, a voltage down converter circuit 52, a detection circuit 53, a substrate bias generating circuit 54, and a main circuit 56. The LSI chip 50 is in the CMOS structure in which an n-type substrate has a p-type well. The I/O circuit 51 performs the input/output of the data in/from the outside. The voltage down converter circuit 52 steps down the voltage inputted to the LSI chip 50. The detection circuit 53 detects the voltage outputted from the voltage down converter circuit 52. The substrate bias generating circuit 54 generates potentials of, for example, −1.5 V and 1.5 V, on the basis of a signal 55 supplied through the detection circuit 53. The main circuit 56 comprises p-channel and n-channel MOSFETs, and has high-voltage operating unit and low voltage operating unit. The LSI chip 50 has the I/O circuit 51, the voltage down converter circuit 52, the detection circuit 53, the substrate bias circuit 54 and the main circuit 56.

In this embodiment, the main circuit unit 56 is divided to the high-voltage operating unit and the low-voltage operating unit, and only the substrate bias of the low-voltage operating unit is controlled. For example, the detection circuit 53 detects the voltage operating the low-voltage operating unit and generates the H- or L-level signal 55 in corresponding to the detected value. The substrate bias generating circuit 54 generates the substrate bias through the pass of the signals 55 and 57 when receiving H-level signal. The substrate bias generating circuit 54 does not generate the substrate bias when receiving L-level signal. As described above, the same advantage as the sixth embodiment can be obtained by controlling the substrate bias using operating voltage of the low-voltage operating unit.

The substrate bias can be controlled by the operating mode of the low-voltage operating unit based on the signal from the I/O circuit 51. In this case, the same advantage as the first embodiment can be obtained. Especially, it is very effective to control the substrate bias of the low-voltage operating unit, since it is difficult to achieve both high-speed performance and low power dissipation when operating voltage is lowered. The detection circuit 53 is not always necessary when the substrate bias is controlled in accordance with the operating mode.

As described above, in this embodiment, the LSI chip 50 comprises the main circuit 56, the substrate bias generating circuit 54, the voltage down converter circuit 52 and the detection circuit 53, and the substrate bias of only the low-voltage operating unit is set to be variable. In the low-voltage operating unit the optimum threshold voltage can be obtained.

In addition, the second embodiment to the sixth embodiment can be applied to the seventh embodiment and eighth embodiment the same as the first embodiment.

This invention is not limited to each of the above embodiments.

The n-type substrate is used in each embodiment, but a p-type Si substrate may be used. Further, a semiconductor other than Si can be used as a substrate material.

In the above embodiments, the semiconductor device is in the CMOS-type well structure in which there is the p-type well at the n-type substrate. Of course, it can be in the CMOS-type well structure in which there is the n-type well at the p-type substrate, which does not depend on the substrate type. It can be applied to a CMOS-type LSI chip, an nMOS-type or pMOS-type integrated circuit, and further a Bi CMOS-type integrated circuit combining the MOS with the bipolar.

There may be a manner that the substrate bias circuit is worked to make the threshold voltage of the MOSFET high, when the ability is not considered important, but the power dissipation is considered important during the operations, while the substrate bias generating circuit is cut off to make the threshold voltage of the MOSFET low when the ability is considered more important.

The above-explained semiconductor device can be variously modified in the range which does not exceed the contents of this invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type having at least one MOSFET circuit which includes at least one p-channel MOSFET and at least one n-channel MOSFET, said MOSFET circuit having a plurality of operation modes, said MOSFET circuit being coupled to a signal line which provides a signal to said MOSFET circuit for switchably selecting a one of said plurality of MOSFET circuit operation modes in which said MOSFET circuit will operate; and bias generating means for supplying a bias voltage to said semiconductor substrate of said first conductivity type and varying said bias voltage in accordance with said selected one of said plurality of operation modes of said MOSFET circuit.

2. A semiconductor device comprising:

a semiconductor substrate of a first conductivity type;

at least one well region of a second conductivity type which is selectively formed on a surface portion of said semiconductor substrate of said first conductivity type;

a MOSFET circuit including at least one p-channel first MOSFET and at least one n-channel first MOSFET formed on said semiconductor substrate of said first conductivity type, and at least one p-channel second MOSFET and at least one n-channel second MOSFET formed on said well region of said second conductivity type, said MOSFET circuit operating at a plurality of operation modes, said MOSFET circuit being coupled to a signal line which provides a signal to said MOSFET circuit for selecting a one of said plurality of MOSFET circuit operation modes in which said MOSFET circuit will operate; and bias generating means for supplying a bias voltage to at least one of said semiconductor substrate of said first conductivity type and said well region of said second conductivity type, and varying said bias voltage supplied to at least one of said semiconductor substrate of said first conductivity type and said well region of said second conductivity type in accordance with said selected one of said plurality of operation modes of said MOSFET circuit.

3. The semiconductor device according to claim 1 or 2, wherein said bias generating means includes a substrate bias generating circuit mounted on said semiconductor substrate of said first conductivity type for changing said bias voltage.

4. The semiconductor device according to claim 3, further comprising an input/output circuit mounted on said semiconductor substrate of said first conductivity type for controlling said substrate bias generating circuit.

5. The semiconductor device according to claim 3, wherein said bias generating circuit is controlled by a signal from a device external to said semiconductor substrate of said first conductivity type.

6. The semiconductor device according to claim 1, wherein said bias generating means includes means for supplying said bias voltage onto said semiconductor substrate of said first conductivity type from a device external to said semiconductor substrate of said first conductivity type in accordance with said selected one of said plurality of operation modes of said MOSFET circuit.

7. A semiconductor device comprising:

a semiconductor substrate of a first conductivity type having at least one MOSFET circuit which includes at least one p-channel MOSFET and at least one n-channel MOSFET, said MOSFET circuit operating at a plurality of operation voltages, said MOSFET circuit being coupled to a control line, said MOSFET circuit operating at a one of said plurality of operation voltages in accordance with a control signal provided on said control line; and bias generating means for supplying a bias voltage to said semiconductor substrate of said first conductivity type and varying said bias voltages supplied to said semiconductor substrate of said first conductivity type in accordance with said selected one of said plurality of operation voltages of said MOSFET circuit.

8. A semiconductor device comprising:

a semiconductor substrate of a first conductivity type;

at least one well region of a second conductivity type which is selectively formed on a surface portion of said semiconductor substrate of said first conductivity type;

a MOSFET circuit including at least one p-channel first MOSFET and at least one n-channel first MOSFET formed on said semiconductor substrate of said first conductivity type, and at least one p-channel second MOSFET and at least one n-channel second MOSFET formed on said well region of said second conductivity type, said MOSFET circuit operating at a plurality of operation modes, said MOSFET circuit being coupled to a control line, said MOSFET circuit operating at a one of said plurality of operation voltages in accordance with a control signal provided on said control line; and bias generating means for supplying a bias voltage to at least one of said semiconductor substrate of said first conductivity type and said well region of said second conductivity type, and varying said bias voltage supplied to at least one of said semiconductor substrate of said first conductivity type and said well region of said second conductivity type in accordance with said selected one of said plurality of operation voltages of said MOSFET circuit.

9. The semiconductor device according to claim 7 or 8, wherein said bias generating means includes a substrate bias generating circuit mounted on said semiconductor substrate of said first conductivity type for changing said bias voltage.

10. The semiconductor device according to claim 9, further comprising a detection circuit which is mounted on said semiconductor substrate of said first conductivity type, for detecting said operation voltages of said main circuit and controlling said substrate bias generating circuit.

11. The semiconductor device according to claim 7, wherein said bias generating means includes means for supplying said bias voltage onto said semiconductor substrate of said first conductivity type in accordance with said selected one of said plurality of operation modes of said circuit.

12. A semiconductor device comprising:

a semiconductor substrate of a first conductivity type having at least one MOSFET circuit which includes at least one p-channel MOSFET and at least one n-channel MOSFET, and having a first circuit unit operating at a first voltage and a second circuit unit operating at a second voltage lower than said first voltage, said second circuit unit having a plurality of operation modes; and bias generating means for supplying a bias voltage to said semiconductor substrate of said first conductivity type, said bias generating means varying said bias voltage in accordance with a particular one of said plurality of operation modes in which said second unit is operating, said particular one of said plurality of operation modes being selected by a signal provided to said at least one MOSFET circuit.

13. The semiconductor device according to claim 12, said bias generating means includes a substrate bias generating circuit mounted on said semiconductor substrate of said first conductivity type for changing said bias voltage.

14. A semiconductor device comprising:

a semiconductor substrate of a first conductivity type having at least one MOSFET circuit which includes at least one p-channel MOSFET and at least one n-channel MOSFET, and having a first circuit unit operating at a first voltage and a second circuit unit operating at a second voltage lower than said first voltage, said second circuit operating at a plurality of operation voltages, said second circuit being coupled to a signal line which provides a signal to said second circuit for selecting a one of said plurality of second circuit operation modes in which said second circuit will operate; and bias generating means for supplying a bias voltage to said semiconductor substrate of said first conductivity type, and varying said bias voltage in accordance with said selected one of said plurality of operation voltages of said second circuit unit.

15. The semiconductor device according to claim 14, said bias generating means includes a substrate bias generating circuit mounted on said semiconductor substrate of said first conductivity type for changing said bias voltage.

16. The semiconductor device according to claim 2, wherein said bias generating means includes means for supplying said bias voltage onto at least one of said semiconductor substrate of said first conductivity type and said well region of said second conductivity type from a device external to said semiconductor substrate of said first conductivity type in accordance with said selected one of said plurality of operation modes of said MOSFET circuit.

17. The semiconductor device according to claim 8, wherein said bias generating means includes means for supplying said bias voltage onto at least one of said semiconductor substrate of said first conductivity type and said well region of said second conductivity type in accordance with said selected one of said plurality of operation voltages of said MOSFET circuit.

* * * * *